(12) United States Patent
Pilsl

(10) Patent No.: US 8,464,141 B2
(45) Date of Patent: Jun. 11, 2013

(54) PROGRAMMABLE ERROR CORRECTION CAPABILITY FOR BCH CODES

(75) Inventor: Michael Pilsl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1034 days.

(21) Appl. No.: 12/191,085

(22) Filed: Aug. 13, 2008

(65) Prior Publication Data

US 2010/0042907 A1 Feb. 18, 2010

(51) Int. Cl.
*G06F 11/00* (2006.01)

(52) U.S. Cl.
USPC .......................................................... 714/782

(58) Field of Classification Search
USPC ................... 714/752, 758, 782, 785
See application file for complete search history.

(56) References Cited

U.S. PATENT DOCUMENTS

| | | | | |
|---|---|---|---|---|
| 5,140,595 A * | 8/1992 | Geldman et al. | ............... | 714/762 |
| 5,323,402 A * | 6/1994 | Vaccaro et al. | ............... | 714/782 |
| 5,440,570 A * | 8/1995 | Wei et al. | ....................... | 714/782 |
| 5,444,719 A | 8/1995 | Cox et al. | | |
| 5,495,488 A * | 2/1996 | Nakamura | ..................... | 714/785 |
| 5,822,337 A | 10/1998 | Zook et al. | | |
| 6,058,500 A * | 5/2000 | DesJardins et al. | ............ | 714/781 |
| 6,181,164 B1 * | 1/2001 | Miller | ............................. | 326/46 |
| 6,405,339 B1 | 6/2002 | Cox et al. | | |
| 6,640,327 B1 * | 10/2003 | Hallberg | ........................ | 714/785 |
| 6,895,545 B2 * | 5/2005 | Parhi | ............................. | 714/781 |
| 7,836,377 B2 * | 11/2010 | Toda | .............................. | 714/763 |
| 2003/0192007 A1 * | 10/2003 | Miller et al. | ................... | 714/782 |
| 2004/0153902 A1 * | 8/2004 | Machado et al. | ............. | 714/710 |
| 2007/0157064 A1 | 7/2007 | Falik et al. | | |

* cited by examiner

*Primary Examiner* — Bryce Bonzo
*Assistant Examiner* — Elmira Mehrmanesh
(74) *Attorney, Agent, or Firm* — Slater & Matsil, L.L.P.

(57) ABSTRACT

An embodiment of the invention relates to a BCH encoder formed with linear feedback shift registers (LFSRs) to form quotients and products of input polynomials with irreducible polynomials of a generator polynomial g(x) of the BCH encoder, with and without pre-multiplication by a factor $x^m$. The BCH encoder includes multiplexers that couple LFSR inputs and outputs to other LFSRs depending on a data input or parity generation state. The BCH encoder can correct up to a selectable maximum number of errors in the input polynomials. The BCH encoder further includes LFSR output polynomial exponentiation processes to produce partial syndromes for the input data in a syndrome generation state. In the syndrome generation state the LFSRs perform polynomial division without pre-multiplication by the factor $x^m$. The exponentiation processes produce partial syndromes from the resulting remainder polynomials of the input data block.

20 Claims, 10 Drawing Sheets

US 8,464,141 B2

PROGRAMMABLE ERROR CORRECTION CAPABILITY FOR BCH CODES

TECHNICAL FIELD

An embodiment of the invention relates generally to encoding and decoding and methods, and more particularly to providing a Bose-Chaudhuri-Hocquenghem (BCH) encoder and decoder with flexible error detection and correction capability.

BACKGROUND

Flash memory devices such as those used in solid-state disks require error correcting codes in order to prevent information loss. Bit error rates in such memory devices are increasing with each new device generation as semiconductor feature sizes are reduced and the number of bits per memory cell is increased. The result is a need for different error correction capabilities in different flash memory controllers and different amounts of reserved semiconductor area for parity bits in successive device generations.

In a flash memory device such as a NAND gate-based memory device, data is generally stored in blocks of, e.g., 512 bytes, i.e., in blocks of 4096 bits. Parity bits are added to each block of data so that a number of bit errors can be detected and corrected. For a block of 512 bytes, 78 parity bits can be added to the 512 bytes to provide error detection and correction capability for up to six bits.

Hardware solutions with programmable error correction capability using Reed-Solomon codes have been used for various error detection and correction applications, e.g., magnetic memory devices such as hard disk drives which generally produce bursts of errors. However, these are not well suited for flash memory devices which suffer from isolated random errors. A BCH code is the preferred protection technique for the random errors encountered in flash memory devices.

A substantial amount of logic and associated semiconductor area must be included in a flash memory controller to provide a high level of encoding and decoding capability such as to correct six bits or more in a block of 512 bytes. It is now common practice to provide a specific design for a flash memory controller to detect and correct a particular number of error bits.

A BCH encoder and decoder employing conventional design practices would switch between different BCH encoder implementations to provide different levels of error detection and correction capability, wasting semiconductor area and limiting programmability to the particular BCH encoders included in the design. In order to provide a common controller that can be used for different flash memory devices, a BCH encoder with programmable error correction capability would provide an advantageous solution, substantially reducing the semiconductor area required for the long BCH block codes used in flash memory devices.

SUMMARY OF THE INVENTION

In accordance with an exemplary embodiment, a BCH encoder and a related method are provided. In an embodiment, a BCH encoder includes $t_{max}$ linear feedback shift registers ("LFSRs"). In a data input state, each LFSR forms a remainder of a respective input stream of bits represented as an input polynomial in a variable x with a respective polynomial $m_i$ in the variable x, with pre-multiplication of the respective $m_i$ polynomial by the factor $x^m$, each of the $t_{max}$ polynomials having a degree m. The data input state is maintained while the input data block is clocked into the BCH encoder. The $m_i$ polynomials (i=1 … $2t_{max-1}$) are irreducible polynomials of a generator polynomial of the BCH encoder. In a parity generation state, each LFSR is configured to form a product of the respective remainder polynomial with the respective $m_i$ polynomial. The parity generation state is maintained while the parity bit sequence is clocked out of the BCH encoder. The BCH encoder further includes $t_{max}$ multiplexers, wherein an output of each multiplexer is coupled to a respective LFSR input. In the data input state, a first input of the first multiplexer is coupled to an input data block to the BCH encoder, and a first input of each successive multiplexer is coupled to an output of the preceding LFSR. In the parity generation state, a second input of the last multiplexer is set to zero and a second input of each preceding multiplexer is coupled to an output of a succeeding LFSR. The remainder represents a parity bit sequence for the input data block to the BCH encoder.

In an embodiment, the BCH encoder is configured to correct up to a selectable maximum of errors in the input data block, the selectable maximum not exceeding $t_{max}$.

In an embodiment, the BCH encoder further includes an excess number of LFSRs that are selectively disabled by an input signal. In an embodiment, the excess number of LFSRs includes LFSRs beyond the number of LFSRs necessary to perform an encoding process to correct up to the selectable maximum number of errors in the input data block.

In an embodiment, the BCH encoder further includes a polynomial exponentiation process coupled to an LFSR output, wherein the BCH encoder in a syndrome generation state performs polynomial division without pre-multiplication by the factor $x^m$, and wherein the exponentiation process in the syndrome generation state produces a partial syndrome from the resulting remainder polynomial of the input data block. In an embodiment, the polynomial exponentiation process raises the respective LFSR polynomial output to a power related to a number of the respective LFSR in the syndrome generation state. The syndrome generation state is maintained during a decoding process.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, and may be described only once in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

Figure 1:
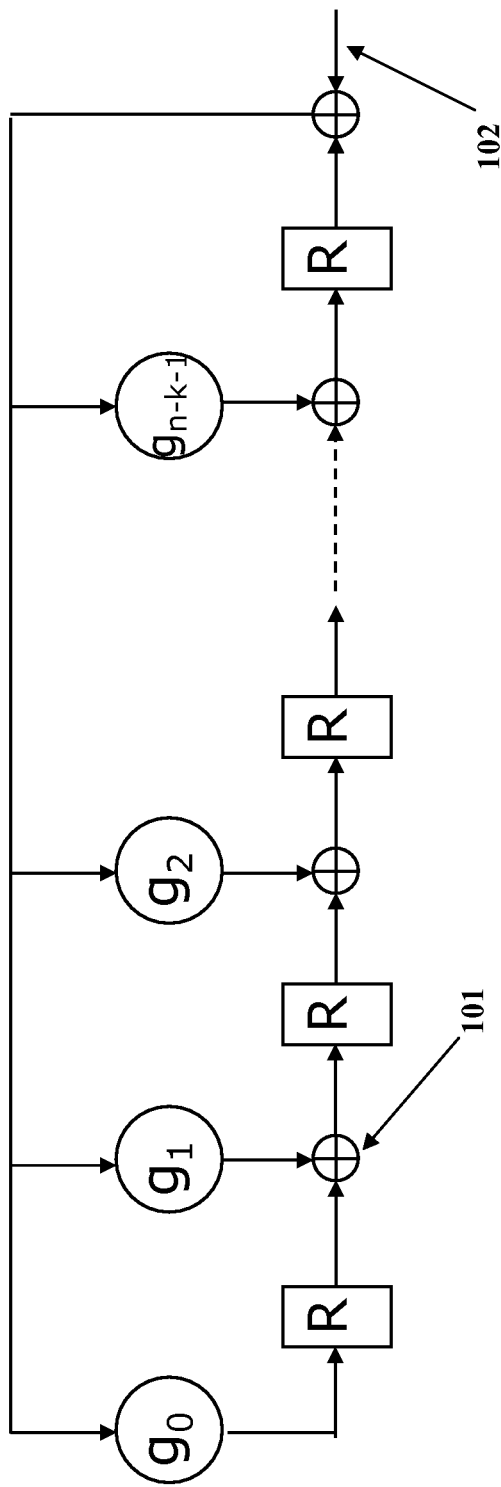
FIG. 1 illustrates a block diagram of a conventional LFSR that can be used to implement a BCH encoding function.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely coding and decoding processes for BCH codes with flexible error correction capability.

An embodiment of the invention may be applied to various encoding and decoding arrangements, for example, to encoding and decoding arrangements in memory devices such as flash and hard disk memory devices. Other encoding and decoding arrangements can be constructed and applied using processes as introduced herein in different contexts using inventive concepts described herein, for example, an encoding and decoding arrangement used to communicate over a noisy communication channel.

An encoder appends parity bits to a data message to provide error detection and correction capability for random bit errors that may be generated during a storage process associated with a memory device or during a transmission process associated with a communication channel. A controller for a device such as a flash memory device is often a separate chip from the flash memory chip itself and includes a process to append parity bits to a block of data transferred to the memory device for storage therein. The controller thus includes an encoding process to append the parity bits to a block of data prior to storage, and a decoding process to examine the stored data and the parity bits and correct up to a number of errors in the stored data before the data is transferred to a host computer.

The use of clocked registers and modulo-2 arithmetic to implement encoders and decoders for block codes based on generator polynomials is well known in the art. For example, C. E. Cox, et al., in U.S. Pat. No. 5,444,719, C. P. Zook, et al., in U.S. Pat. No. 5,822,337, C. E. Cox, et al., in U.S. Pat. No. 6,405,339, and O. Falik, et al., in U.S. patent application 2007/0157064 describe the use of sequential linear processes to perform coding and decoding for block codes. These patents and the patent application are hereby referenced and incorporated herein.

BCH codes are generally preferred for flash memory devices, based on the isolated random nature of errors in these storage devices. The properties of a BCH code word can be described as follows: A BCH code word is of length $n=2^{m-1}$, for a parameter m. To provide error correction capability of "t" bits, the minimum Hamming distance between code words must be at least $d_{min} \geq 2 \cdot t+1$. For k message bits, the number of check bits ("parity bits") is $n-k \leq m \cdot t$, where equality normally holds. The parameter m is selected to provide the required error correction capability t in view of the number of message bits k and the number of check bits.

As an example, for k=4096 message bits (corresponding to 512 bytes of data, the typical sector size in a magnetic memory-based computer storage system) and up to t=6 error bits that can be corrected, the parameter m is selected to be 13, and the code word is of length $n=m \cdot t+k=4174$ bits. This is generally abbreviated as a shortened "(4174, 4096, 6)" BCH code.

The process of correcting a code word containing one or more bit errors is to identify a closest legal code word. The minimum separation Hamming distance of $d_{min} \geq 2 \cdot t+1$ provides the geometric property for selecting a closest legal code word with up to t errors. A smaller $d_{min}$ would render the choice of a closest legal codeword ambiguous.

A generator polynomial g(x) of a BCH code is the LCM (Least Common Multiple) of the set of irreducible polynomials $\{m_1(x), m_3(x), \ldots, m_{2t-1}(x)\}$, with $m_1(x), \ldots, m_{2t-1}(x)$, being polynomials of degree m. Every irreducible polynomial of degree m divides $x^{2^{m-1}}+1$. Instead of using a direct implementation of the generator polynomial with fixed t-bits of error correction capability in a single LFSR circuit, $t_{max}$ interconnected LFSRs are introduced to implement individual divider/multiplier circuits for the individual irreducible polynomials $m_1(x), m_3(x), \ldots, m_{2tmax-1}(x)$. Such a configuration as introduced herein allows fully programmable error correction capability without unnecessary area overhead or with limited programmability compared to conventional LFSR implementations.

Turning now to FIG. 1, illustrated is a conventional LFSR that can be used to implement a BCH encoding function to produce a fixed number of parity bits $n-k=m \cdot t$. The LFSR includes n−k one-bit registers R, coupled to coefficients $g_0, \ldots g_{n-k-1}$ and to n−k modulo-2 summers such as modulo-2 summer 101. The feedback coefficients $g_0, \ldots g_{n-k-1}$ are set to the coefficients of the generator polynomial $g(x)=g_{n-k-1} \cdot x^{n-k-1}+g_{n-k-2} \cdot x^{n-k-2}+ \ldots +g_0$ for the required BCH code to produce parity bits in the registers R. All the registers R are initially cleared to "0" to create an initial operating point. An input bit stream of data of length k is then clocked into the encoder on input line 102 to produce the required n−k parity bits in the n−k registers R. The n−k parity bits are appended at the end of the k message bits, and the total n bits are then stored in the flash memory device. Accordingly, a flash memory device is constructed with "spare" semiconductor memory area to accommodate the appended parity bits. All of the arithmetic operations illustrated in FIG. 1 (and in the following figures) are performed with modulo-2 "exclusive-or" arithmetic, i.e., arithmetic defined over a Galois field GF(2).

The conventional LFSR illustrated in FIG. 1 is constructed with a fixed number of registers and is not programmable with respect to a maximum error correction capability. It is recognized that flash memory devices are rapidly increasing in memory density from generation to generation, and include larger spare areas for parity bits to accommodate the increasing levels of data errors associated with the higher memory densities. Thus, it is desirable to design a flash memory controller for encoding and decoding BCH codes that can flexibly accommodate the increasing levels of bit error detection and correction. For example, for one product it may be necessary to correct up to six bit errors in a 512 byte block, and for another, up to eight bit errors.

Figure 2:
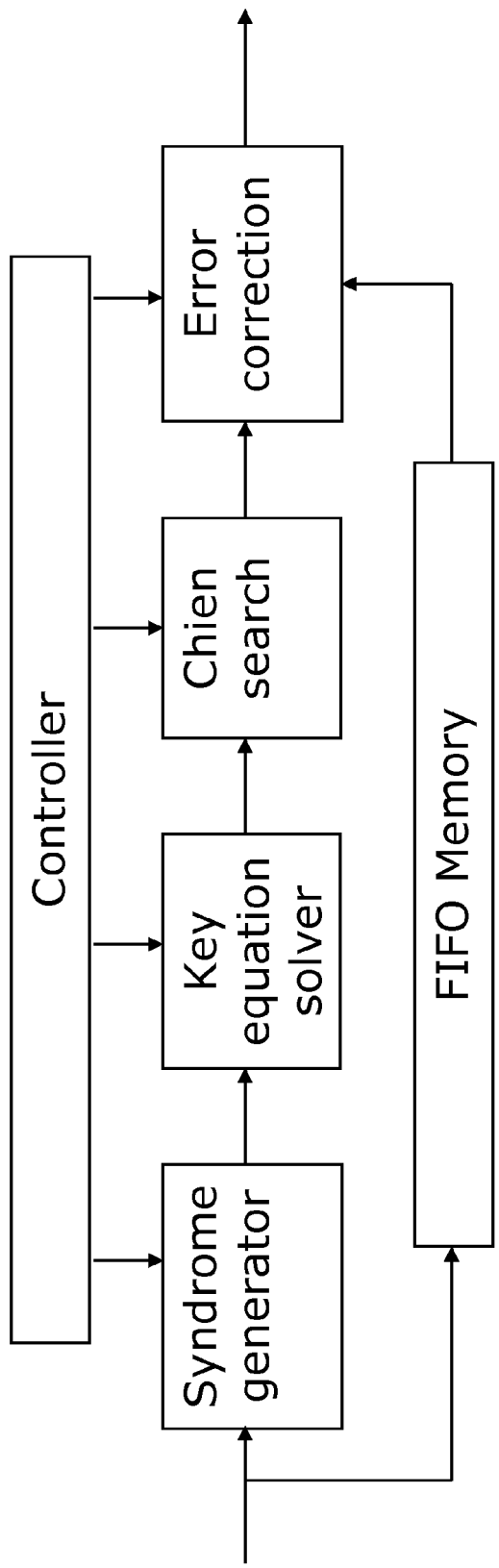
FIG. 2 illustrates a block diagram showing the structure of a conventional BCH decoder.

Turning now to FIG. 2, illustrated is a block diagram showing the structure of a conventional BCH decoder. When data is read back from a flash memory device, several steps are performed in the BCH decoder to detect and correct the bit errors. The first decoding step is syndrome generation for the block of data of length n read back from the flash memory device including the n−k parity bits. The syndromes are a sequence of binary words related to bit errors in the data read back from the flash memory device. The syndromes define a set of equations that are solved in the "key equation solver" described below. All syndromes of zero are indicative of no errors. Syndrome generation is implemented with constant, finite-field multipliers and finite field adders. The number of (used) syndromes can be made programmable in an embodiment up to a maximum designed error correction capability.

The second decoding step is execution of the key equation solver to calculate a bit error location polynomial. A common implementation uses an iterative Massey-Berlekamp algorithm that is known in the art. This produces a polynomial that is the input to the Chien search described in the next step.

The third decoding step is execution of a "Chien search" on the bit error location polynomial. The Chien search is named after R. T. Chien for his paper entitled "Cyclic Decoding Procedure for the Bose-Chaudhuri-Hocquenghem Codes," IEEE Transactions on Information Theory, Vol. IT-10, pp. 357-363, October 1964, which is hereby referenced and incorporated herein. The Chien search is an iterative algorithm known in the art for determining roots of polynomials defined over a Galois field. The error location polynomial is evaluated for every bit position of the code word. If the error location polynomial has a root at an evaluated bit position, an error location has been found. Each root represents a one-bit error in the k message bits or the n−k parity bits. If more than t roots are found for a particular block of n data bits, then an error condition has occurred wherein more errors are detected then can be reliably corrected because the Hamming condition on code word separation distance $d_{min} \geq 2 \cdot t + 1$ has not been satisfied.

The next decoding step is error correction. This process corrects the memory errors that were identified by the Chien search. For binary BCH codes, the bit at the found error location is inverted in a FIFO (first in, first out) memory. The FIFO memory is a convenient vehicle to hold the received data until all errors have been corrected.

A controller manages the operation of these several steps.

Referring back to FIG. 1, it is necessary to set the coefficients of the generator polynomial $g(x) = g_{n-k-1} \cdot x^{n-k-1} + g_{n-k-2} \cdot x^{n-k-2} + \ldots + g_0$ for the required BCH code for the encoder for the number of errors t that are desired to be corrected. For example, to correct six errors for the parameter m equal to 13, then $13 \cdot 6 = 78$ parity bits are required, as are 78 one-bit registers for the LFSR. The polynomials $m_i(x)$ and the corresponding generator polynomial $g(x)$ are tabulated for BCH coding for various numbers t of correctable errors in various papers and textbooks, and will not be repeated here in the interest of brevity. The polynomial $g(x)$ is produced by forming the product of the polynomials $m_i(x)$. As described later hereinbelow, the error correction capability t of an encoder can be made programmable as introduced herein by using individual divider circuits for the polynomials that are reconfigured as multipliers during shift-out of the parity check bits.

Figure 3:
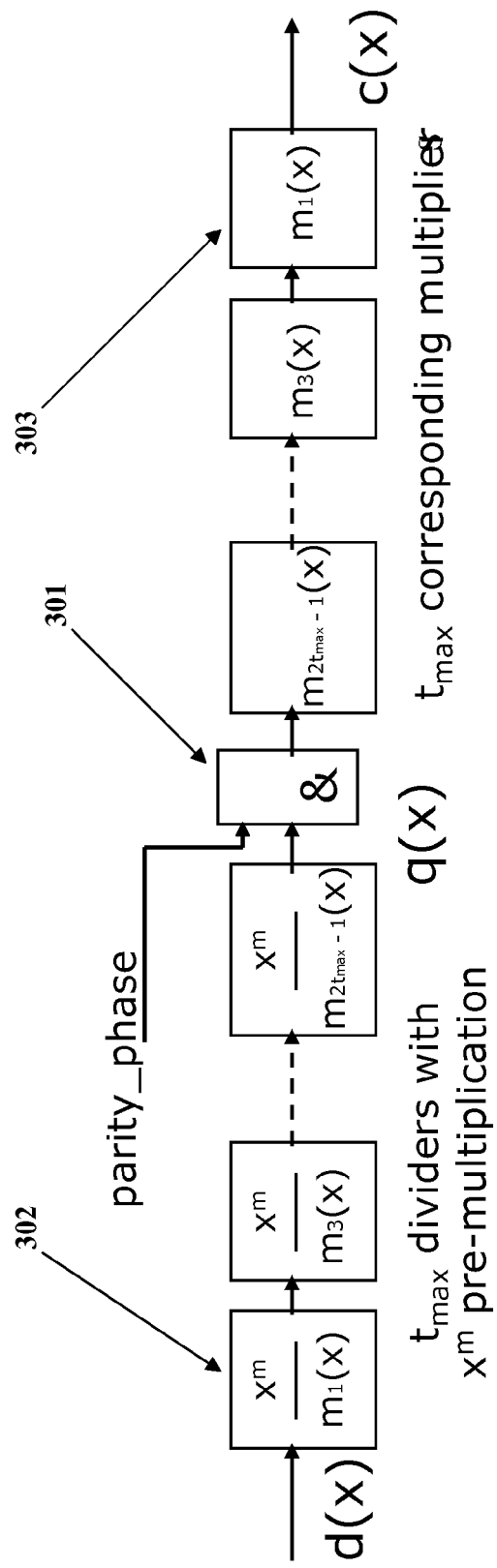
FIG. 3 illustrates a block diagram illustrating the mathematical principles to make a BCH encoder programmable to correct a number of bit errors, constructed according to an exemplary embodiment.

Turning now to FIG. 3, illustrated is a block diagram illustrating the mathematical principles to make a BCH encoder programmable to correct t bit errors employing an embodiment. This same hardware can be used for BCH encoding and decoding processes, as well as encoding and decoding processes with a selectable number of correctable errors. Instead of implementing the generator polynomial $g(x)$ by an LFSR, the polynomial $d(x)$ representing the input data is divided by $t_{max}$ individual $m_i(x)$ polynomials each of respective degree m and simultaneously multiplied by the factor $x^m$, followed by $t_{max}$ multiplications of the same $m_i(x)$ polynomials. Error correction capability now can be easily controlled by additional pairs of corresponding polynomial divider and multiplier stages.

The input polynomial illustrated on the left side of FIG. 3 is the message data polynomial $d(x)$ of degree k−1, e.g., 4096 bits corresponding to a codeword polynomial $c(x)$ of degree n−1. A polynomial has a one-to-one relationship with a sequence of data bits. For example, the data sequence "1001" corresponds to the polynomial $1 \cdot x^{k-1} + 0 \cdot x^{k-2} + 0 \cdot x^{k-3} + 1 \cdot x^{k-4}$ for the variable x that can assume binary values 0 and 1. At the beginning of a block of data, the registers in each of the dividers and multipliers are initialized to zero. The message data polynomial $d(x)$ is then fed as input to a sequence of divider blocks for the polynomials $m_i(x)$ of respective degree m with pre-multiplication by the factor $x^m$. For every error that is desired to be corrected, such as six errors, a pre-multiplier/divider process is required. The result of these steps produces the polynomial $q(x) = [x^m / m_1(x)] \cdot [x^m / m_3(x)] \cdot \ldots \cdot [x^m / m_{2tmax-1}(x)]$. The result of these pre-multiplier divider processes is then fed forward to a series of $t_{max}$ corresponding multipliers, $m_{2tmax-1}(x), \ldots, m_3(x), m_1(x)$, organized in a mirrored sequence to that of the divider processes. The result produces the polynomial $c(x) = g(x) \cdot q(x) + r(x)$, where $r(x) = x^{n-k} \cdot d(x) \mod g(x)$. The polynomial $r(x)$ is the remainder polynomial of degree n−k (representing parity check bits). Each divider and multiplier register in this sequence comprises m (e.g., 13) bits. The parity phase is set equal to "1" at the AND gate 301 to shift out the first k cycles at the output: $c(x) = g(x) \cdot q(x)$. The parity phase is set equal to "0" at the AND gate 301 to shift out the remaining n−k cycles at the output, i.e., the remainder polynomial $r(x)$. When the parity phase is set equal to "0", only 0s are shifted into the multiplier stages.

What has not been obvious is that the registers in a divider block and in a corresponding multiplier block in FIG. 3 have the same contents at any clock cycle. For example, in FIG. 3 the m-bit (e.g., 13-bit) contents of block 302 at any clock cycle are the same as the m-bit contents of block 303, suggesting that there is redundant hardware present in the process. This observation is used to employ a minimum number of registers to implement a BCH encoder.

Figure 4:
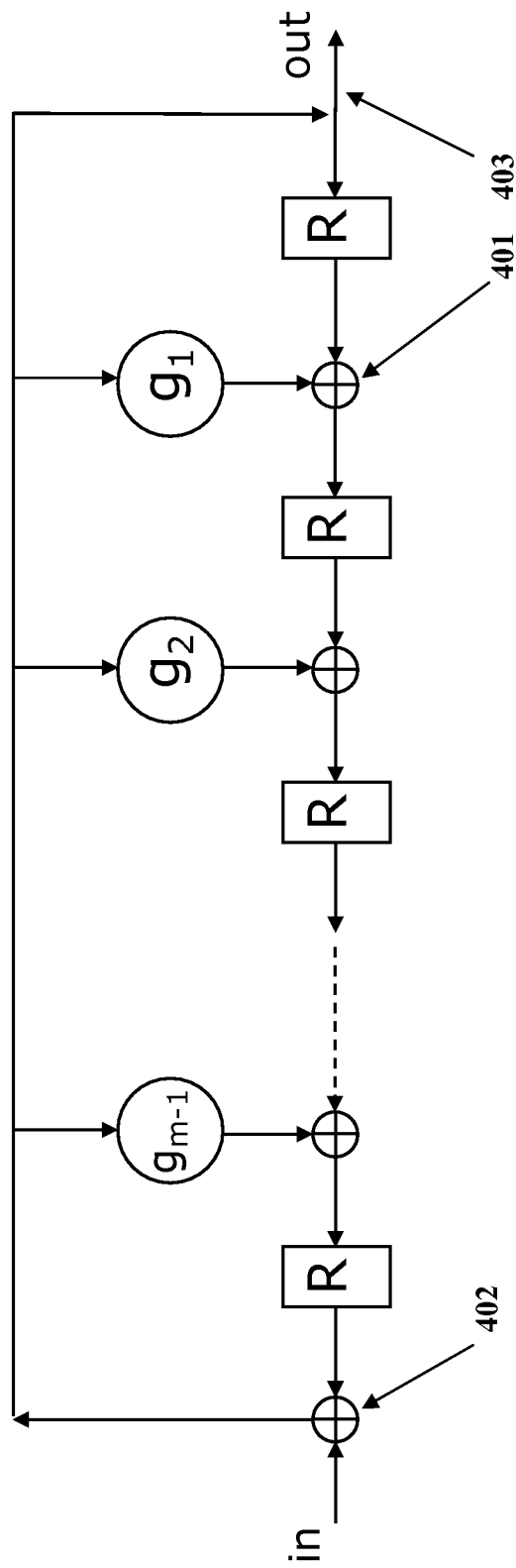
FIG. 4 illustrates a block diagram of a conventional LFSR that implements binary divider circuitry with pre-multiplication by the factor $x^m$.

Turning now to FIG. 4, illustrated is a conventional LFSR that implements binary polynomial divider circuitry with pre-multiplication by $x^m$. The LFSR includes m one-bit registers R, coupled to coefficients $g_1, \ldots g_{m-1}$ and m modulo-2 adders such as adder 401. The feedback coefficients $g_1, \ldots g_{m-1}$ are set as necessary to perform a particular polynomial divider function. All the registers R are initially cleared to "0" to create an initial operating point. An input bit stream of data is clocked into the encoder on input line 402 to produce the required sequence of bits at the output 403. The binary divider/pre-multiplier illustrated in FIG. 4 provides the corresponding capability to that illustrated in the left portion of FIG. 3 before the AND gate 301.

Figure 5:
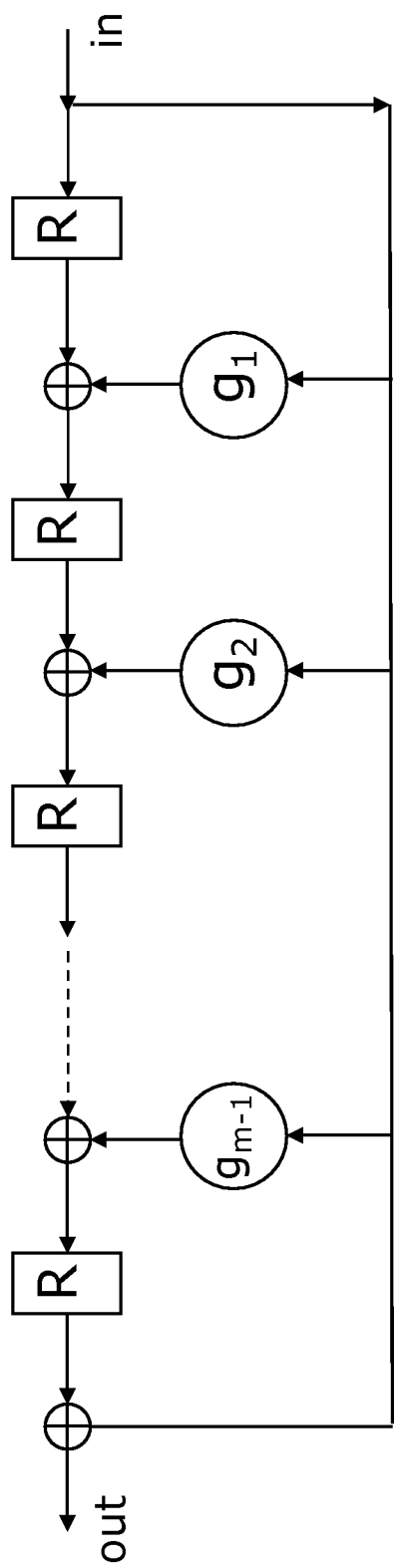
FIG. 5 illustrates a block diagram of a conventional LFSR configured to perform binary multiplication by a polynomial.

Turning now to FIG. 5, illustrated is a conventional LFSR configured to perform binary multiplication by a polynomial represented by the coefficients $g_i$. This LFSR exhibits substantially the same logical structure as that illustrated in FIG. 4 with the exception of reversal of the input and output nodes.

The rightmost register of the multiplier LFSR corresponds with the rightmost register of the divider LFSR. In addition, the coefficients $g_i$ also exhibit a direct correspondence between the two LFSRs, suggesting that the circuit illustrated in FIG. 4 can be combined with the circuit illustrated in FIG. 5 with only modest modifications.

Figure 6:
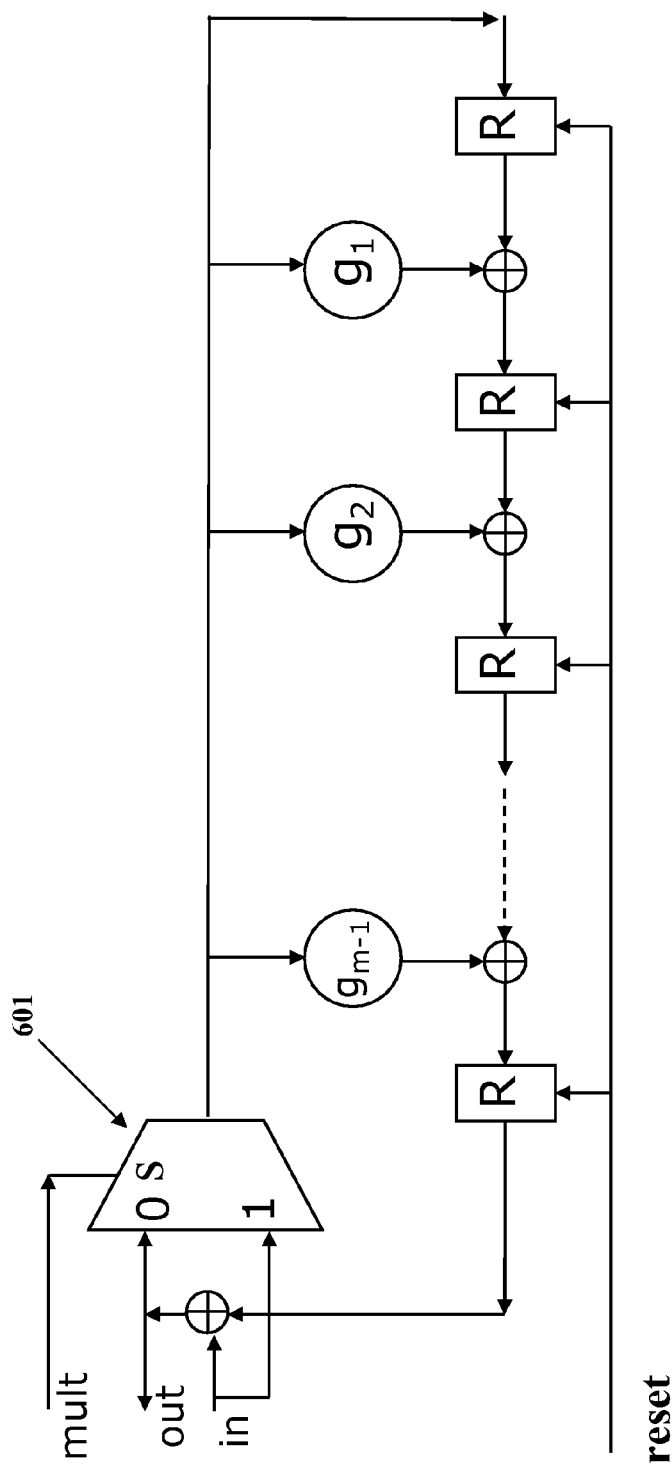
FIG. 6 illustrates a block diagram of an LFSR implementing a combined binary polynomial divider with $x^m$ pre-multiplication and a polynomial multiplier, constructed according to an embodiment.

Turning now to FIG. 6, illustrated is an embodiment of an LFSR implementing a combined binary polynomial divider (with $x^m$ pre-multiplication) and a polynomial multiplier, combining the functionality of the circuits illustrated in FIGS. 4 and 5. The combined circuit relies on the observation noted above that the registers of corresponding divider and multiplier circuits have the same content at each clock cycle, allowing them to be combined into a single LFSR so that the overall number of registers is the same as for a conventional BCH encoder. The circuit includes an additional one-bit control signal "mult" to the multiplexer 601 that accommodates switching between the multiplication mode and the division mode of operation. The control signal mult selects the operational input to the multiplexer 601 that is forwarded to its output. If mult=1, the circuit is operational as a polynomial multiplier. If mult=0, the circuit is operational as a polynomial divider (with $x^m$ pre-multiplication). The signal "reset" is a reset signal that resets the contents of the registers R to zero to initialize the process.

Figure 7:
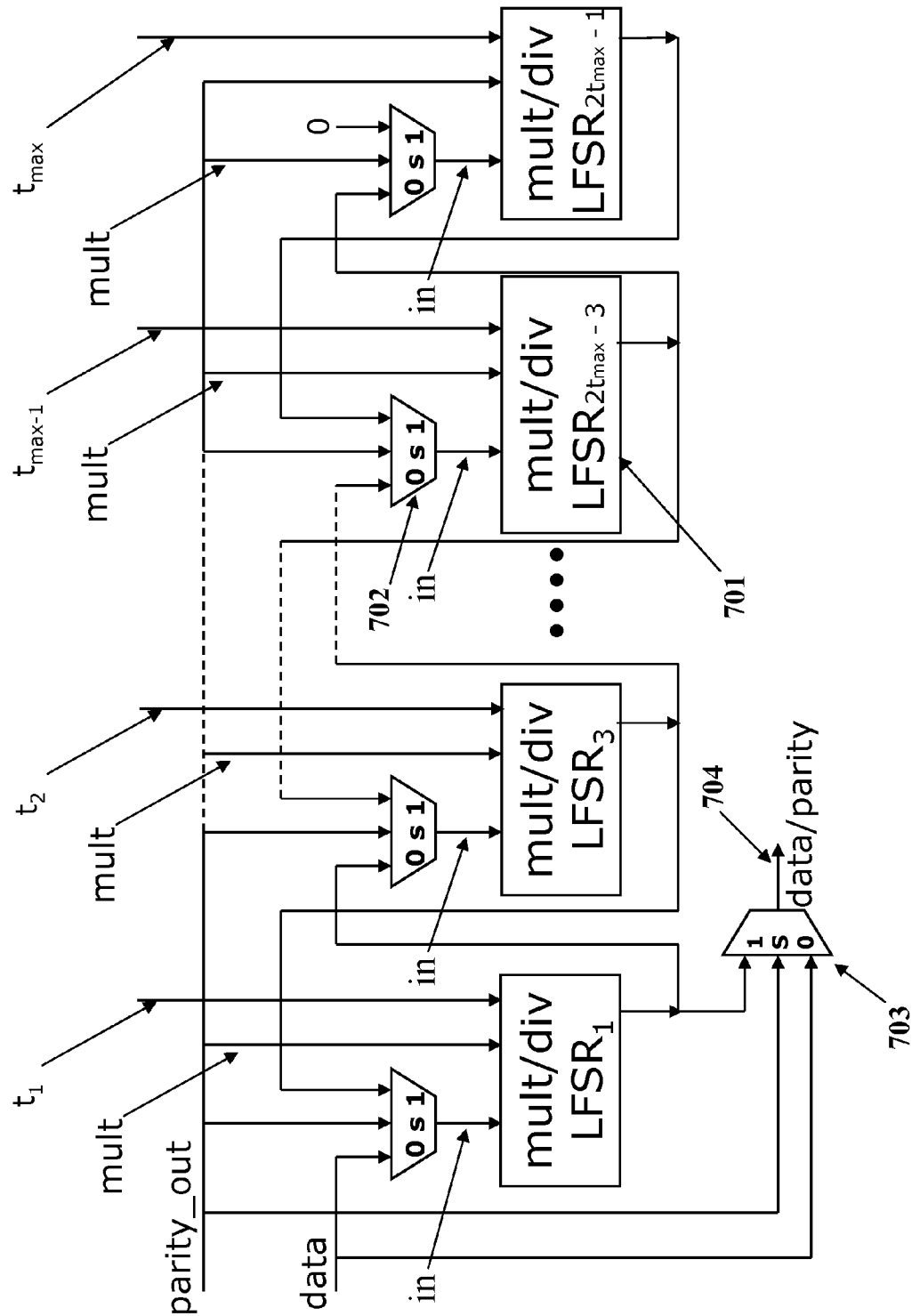
FIG. 7 illustrates a block diagram of a programmable BCH encoder for a range of correctable errors up to a maximum number, constructed according to an embodiment.

Turning now to FIG. 7, illustrated is a block diagram of an embodiment of a programmable BCH encoder for a range of correctable errors up to a maximum number $t_{max}$. Relying on certain mathematical characteristics of BCH codes, the error correction capability of the BCH encoder is advantageously made programmable by using individual divider circuits for the polynomials $m_1(x) \ldots m_{2tmax-1}(x)$, that are re-configured as multipliers during shift-out of parity check bits. The blocks "mult/div LFSR$_i$", i=1, 3, . . . , $2t_{max}-1$, such as block 701, each represent the combined binary divider (with $x^m$ pre-multiplication)/multiplier circuit illustrated in FIG. 6.

There are $t_{max}$ instances of the combined divider/multiplier circuits to selectively support up to $t_{max}$ correctable errors. In a particular application, for example in a particular flash memory device, the maximum number of errors that can be corrected is related to the amount of spare area provided for the parity bits.

Multiplexers, such as multiplexer 702, selectively transfer an input signal to the output thereof dependent on the value of the binary control signal "s" that is coupled to the input control signal "parity_out." The signal parity_out corresponds with the signal "mult" illustrated in FIG. 6. The signals "$t_2$," etc., are coupled to the "reset" input illustrated in FIG. 6.

The maximum programmable error correction capability $t_{max}$ provided by the circuit illustrated in FIG. 7 is limited by the number of divider/multiplier circuits that are actually implemented. The error correction capability, and thus the number of parity check bits, is programmable by control of the signals $t_1, t_2$, etc., that keep all divider/multiplier LFSRs in a reset state when they are not needed. For example, if it is desired to correct only one error, then the signal $t_1$ would be set to 1, and the remaining signals to the right would be set to 0. For this example, where only one bit of error correction is required, then all LFSRs to the right of the first LFSR are kept in a reset state by the signals $t_2, \ldots, t_{max}$.

In operation, the parity out control signal is maintained de-asserted (i.e., set to 0) for k clock cycles while the k data bits are shifted into the circuit on the input line "data." During this data entry phase after the registers have been initially reset to zero, the input data flows from the left to the right through the divider/multiplier LFSR blocks. The LFSRs are configured as dividers with $x^m$ pre-multiplication. After the last data bit has been processed, the parity out signal is asserted (i.e., set to 1) for n−k=m·t clock cycles, and the (n−k=m·t) parity bits are shifted out. During this parity generation phase, the data flows from the right to the left through the divider/multiplier LFSR blocks. In this phase, the LFSRs are configured as a chain of multipliers, which provide the parity polynomial coefficients of r(x) at the output. Multiplexer 703 selectively combines the data and the parity bits based on the input signal parity out to provide a clocked sequence of output data on line 704.

A further embodiment combining a BCH encoder and a BCH syndrome generator is now introduced. Again, the error correction capability is fully programmable.

A binary divider LFSR with pre-multiplication by $x^m$ was previously described hereinabove with reference to FIG. 4.

Figure 8:
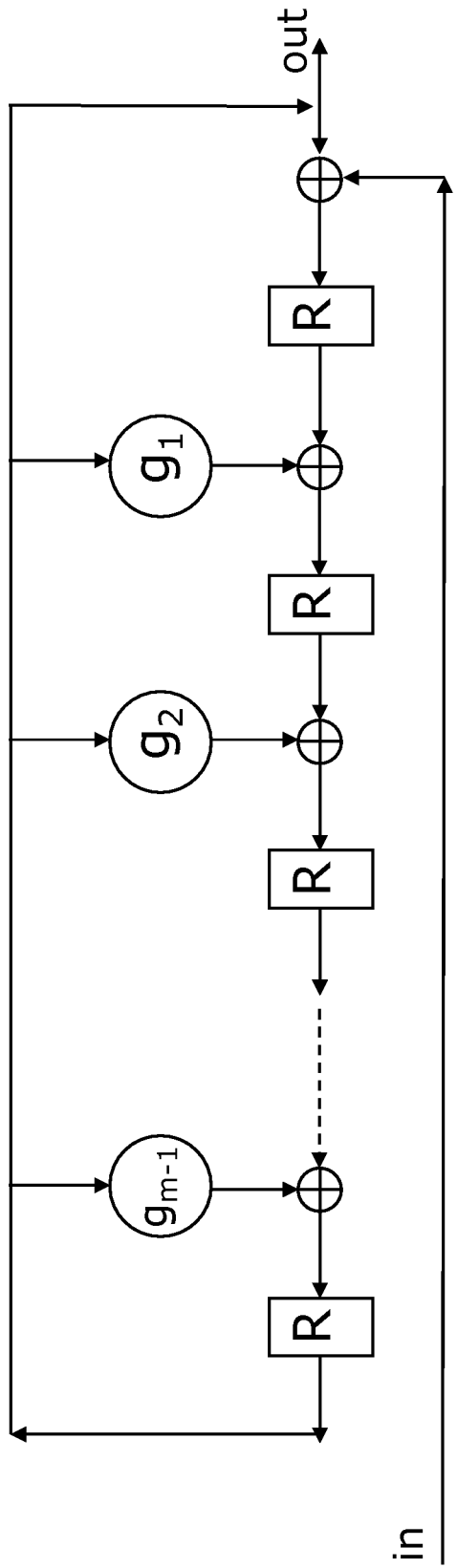
FIG. 8 illustrates a block diagram of a conventional binary divider LFSR without $x^m$ pre-multiplication.

Turning now to FIG. 8, illustrated is a block diagram of a conventional binary divider LFSR without pre-multiplication by $x^m$. On comparing the binary divider with pre-multiplication illustrated in FIG. 4 with the binary divider without pre-multiplication illustrated in FIG. 8, it is apparent that both circuits can be combined with the inclusion of one multiplexer.

Figure 9:
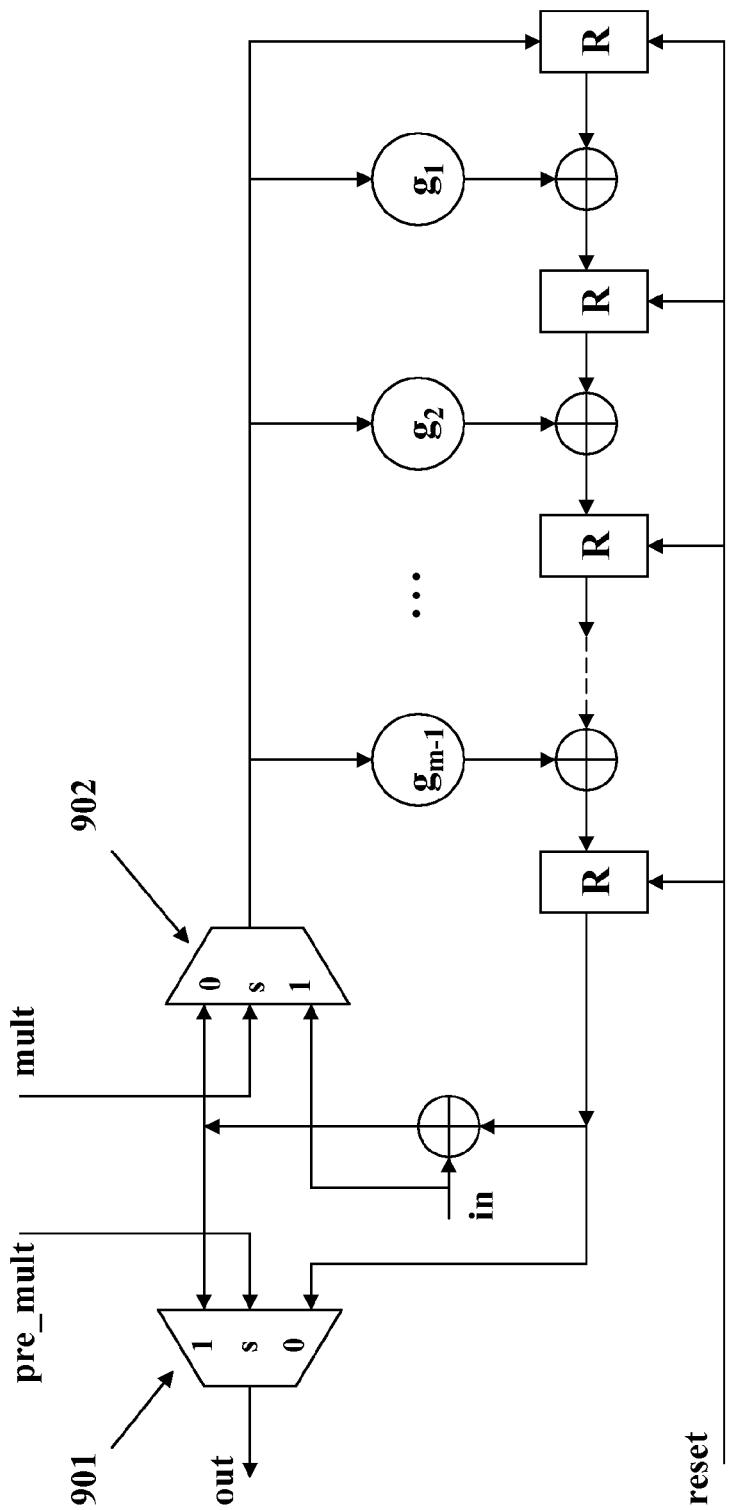
FIG. 9 illustrates a block diagram of a combined LFSR circuit for BCH encoding and syndrome generation that advantageously can be used as a building block for a BCH encoder/syndrome generator with a programmable level of error correction capability, constructed according to an embodiment.

Turning now to FIG. 9, illustrated is a block diagram of a combined LFSR circuit for BCH encoding and syndrome generation in an embodiment that advantageously can be used as a building block for a BCH encoder/syndrome generator with programmable error correction capability. The LFSR circuit includes registers R and binary coefficients $g_1, g_2, \ldots, g_{m-1}$ that are coefficients of the related irreducible polynomial factors $m_i(x)$. The LFSR circuit further includes multiplexers 901 and 902 responsive to control signals "pre_mult" and "mult" that enable or disable polynomial division and enable or disable pre-multiplication by the factor $x^m$. If mult=1 then polynomial multiplication is enabled. If mult=0 then polynomial division with or without pre-multiplication is enabled. If pre_mult=1, then pre-multiplication by the factors $x^m$ is enabled.

Figure 10:
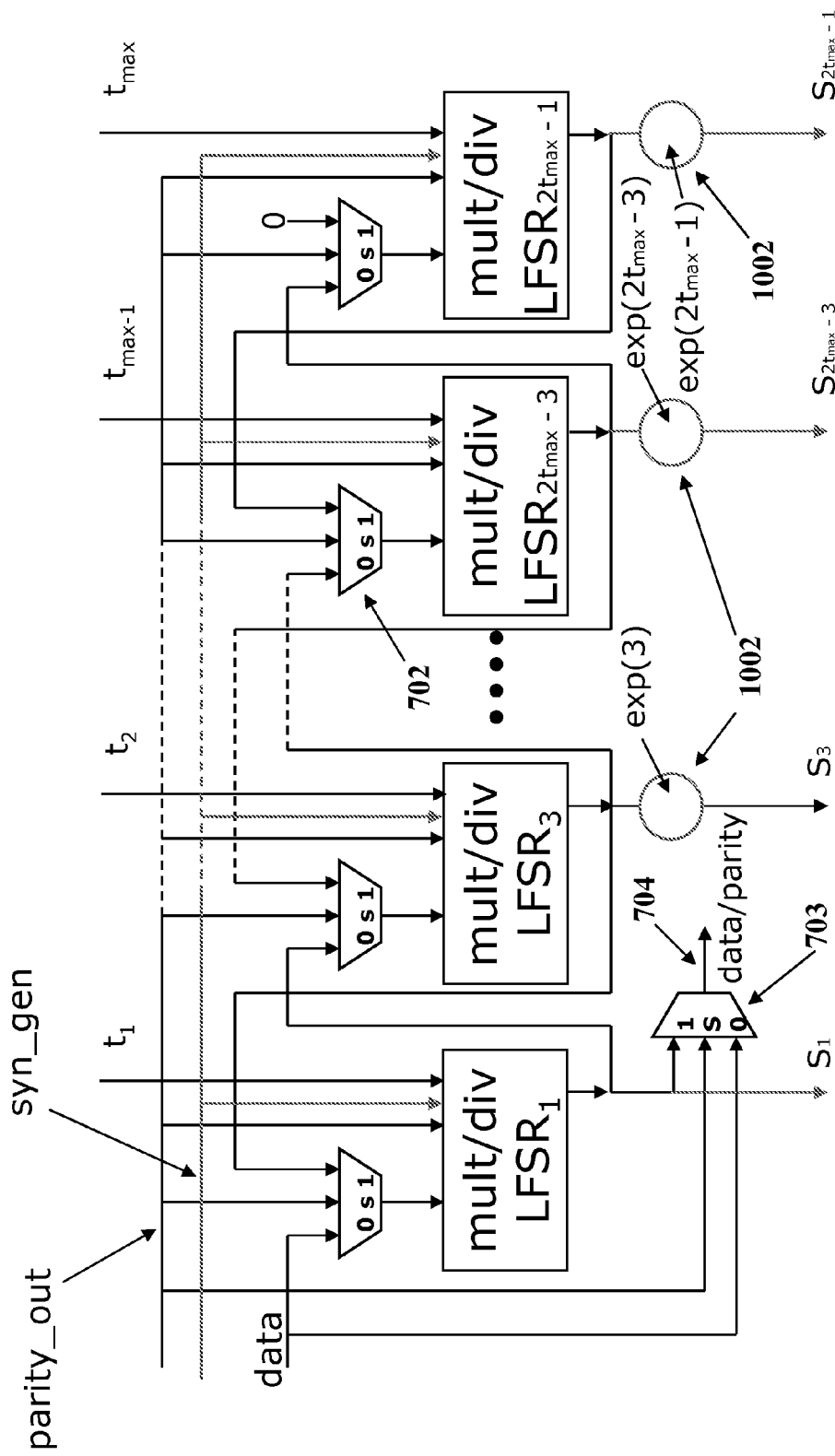
FIG. 10 illustrates a block diagram of a combined BCH encoder/syndrome decoder with a programmable level of error correction capability, constructed according to an embodiment.

Circuitry for syndrome generation can be reused as a programmable BCH-encoder if divider circuits (LFSRs) are used for syndrome generation. Turning now to FIG. 10, illustrated is a block diagram of an embodiment of a combined BCH encoder/syndrome decoder with programmable error correction capability. The blocks 1002 represent exponentiation of an input polynomial to the indicated power, which can be performed using techniques well known in the art. Remaining elements in FIG. 10 similar to those in FIG. 7 will not be redescribed in the interest of brevity. The embodiment illustrated in FIG. 10 provides the capability to multiply or to divide by a polynomial. In the dividing mode it has the capability to provide or to disable pre-multiplication by the factors $x^m$. Thus, three modes of operation necessary for encoding and decoding are provided by the circuit illustrated in FIG. 10 using the set of LFSRs.

By asserting the signal "syn_gen," the circuitry is put into a syndrome generation mode. The signal syn_gen illustrated in FIG. 10 corresponds to the signal pre_mult (i.e., division without pre-multiplication). The signal parity_out corresponds to the signal mult. It is noted that the signals syn_gen and mult cannot both be asserted (i.e., set equal to 1) at the same time. After processing received code word bits, which consist of the message bits represented by the polynomial d(x) followed by the parity check bits represented by the remainder polynomial r(x), the LFSR registers contain the remainder produced by dividing the received code word by the individual irreducible polynomials $m_1(x), m_3(x), \ldots, m_{2tmax-1}(x)$. Syndrome data is generated by dividing input and parity data by these polynomials. The partial syndromes $S_i$, $i=1, 3, \ldots 2t_{max}-1$, can then be calculated by exponentiation of the resulting polynomial remainders to the power i. The even numbered partial syndromes $S_i$, $i=2, 4, \ldots 2t_{max}-2$, can be calculated from the partial syndromes $S_i$, $i=1, 3, \ldots$, $2t_{max}-1$ using techniques well known in the art (i.e., $S_{2i}=S_i^2$). Thus, capability to generate a syndrome can be provided with only modest modification to the LFSR structure illustrated in FIG. 7.

The combined BCH encoder/syndrome generator allows abundant sharing of hardware resources, especially the registers R, which has a large impact on overall semiconductor area for long BCH block codes, such as the BCH codes used to provide error detection and correction capability for NAND flash memories.

From a practical perspective, for a 512 byte/4096 bit block, to increase the number of correctable errors by one, i.e., to increase $t_{max}$ by one, requires an additional 13 parity bits (recalling that the number of parity bits n−k is generally equal to m·t, where m=13 in the example discussed). To correct six errors requires 6·13=78 parity bits. However, twice as many partial syndromes are required. For example, twelve 13-bit partial syndromes are required to correct six errors for a 512 byte/4096 bit block. As described hereinabove, the number of correctable errors can be changed on the fly up to a maximum number limited by the number of registers included in the design. Spare area of a particular flash device is always same, thus there is no advantage to adapt a level of error correction over its lifetime. However, bit error rate increases with every flash device generation, and is quite different between an SLC (single level cell) and an MLC (multi level cell) flash device. Thus, an adjustable level of error correction is mandatory for flash controllers covering several generations and types of flash devices as well as attaching a mix of SLC and MLC devices to the same flash controller. Such an arrangement as introduced herein also allows an adjustable level of error correction based on continuing operational experience with a particular device that allows a greater number of errors to be corrected with slightly compromised operating speed as a device ages. A decision to change the number of correctable errors can be readily made based on statistics accumulated over time of past error correcting experience with the device. The initial number of correctable errors can be selected after a device is manufactured.

Digital circuits are generally implemented with 8-bit bytes. A practical circuit implementation of an LFSR can be structured with inner data loops that operate one bit at a time, and with an outer loop that operates on bytes of data.

A general reference for encoding and decoding techniques related to BCH codes is the book by W. W. Peterson and E. J. Weldon, entitled "Error-Correcting Codes," Cambridge, Mass., published by MIT Press, 1972.

The concept has thus been introduced of forming a BCH encoder with $t_{max}$ LFSRs, each LFSR configured in a data input state to form a remainder of a respective input stream of bits represented as an input polynomial in a variable x with a respective polynomial $m_i$ associated with an LFSR with pre-multiplication of the respective $m_i$ polynomial by the factor $x^m$, each of the $t_{max}$ polynomials having a degree m. In a parity generation state, each LFSR is configured to form a product of the respective remainder polynomial with the respective $m_i$ polynomial. The BCH encoder further includes $t_{max}$ multiplexers, wherein an output of each multiplexer is coupled to a respective LFSR input. In the data input state, a first input of the first multiplexer is coupled to an input data block to the BCH encoder, and a first input of each successive multiplexer is coupled to an output of the preceding LFSR. In the parity generation state, a second input of the last multiplexer is set to zero and a second input of each preceding multiplexer is coupled to an output of a succeeding LFSR. In an embodiment, the remainder represents a parity bit sequence for the input data block to the BCH encoder. The parity generation state is maintained while the parity bit sequence is clocked out of the BCH encoder. The data input state is maintained while the input data block is clocked into the BCH encoder.

In an embodiment, the BCH encoder is configured to correct up to a selectable maximum of errors not exceeding $t_{max}$ in the input data block.

In an embodiment, the BCH encoder further includes an excess number of LFSRs that are selectively disabled by an input signal. In an embodiment, the excess number of LFSRs comprise LFSRs beyond the number of LFSRs necessary to perform an encoding process to correct up to the selectable maximum of errors in the input data block. In an embodiment, the $t_i$ polynomials are irreducible polynomials of a generator polynomial of the BCH encoder.

In an embodiment, the BCH encoder further includes a polynomial exponentiation process coupled to an LFSR output, wherein the BCH encoder in a syndrome generation state performs polynomial division without pre-multiplication by the factor $x^m$, and wherein the exponentiation process in the syndrome generation state produces a partial syndrome from the resulting remainder polynomial of the input data block. In an embodiment, the polynomial exponentiation process raises the respective LFSR polynomial output to a power related to a number of the respective LFSR in the syndrome generation state.

Another exemplary embodiment provides a method of operating a BCH encoder. In an embodiment, the method includes forming $t_{max}$ LFSRs. In a data input state, the method includes forming in each LFSR a remainder of a respective input stream of bits, represented as an input polynomial in a variable x, with a respective one of $m_i$ polynomials of a degree m in the variable x with pre-multiplication of the respective $m_i$ polynomial by the factor $x^m$. In a parity generation state, the method includes forming a product in each LFSR of the respective remainder polynomial with the respective $m_i$ polynomial. The method further includes coupling a respective output of $t_{max}$ multiplexers to a respective input of the $t_{max}$ LFSRs, and coupling a first input of the first multiplexer to an input data block to the BCH encoder. In the data input state, the method includes coupling a first input of each successive multiplexer to an output of the preceding LFSR. In the parity generation state, the method includes setting a second input of the last multiplexer to zero and coupling a second input of each proceeding multiplexer to an output of a succeeding LFSR. In an embodiment, the remainder represents a parity bit sequence for the input data block to the BCH encoder.

In an embodiment, the method includes maintaining the parity generation state while clocking the parity bit sequence out of the BCH encoder. In an embodiment, the method further includes maintaining the data input state while clocking the input data block into the BCH encoder.

In an embodiment, the method includes configuring the BCH encoder to correct up to a selectable maximum number $t \leq t_{max}$ of errors in the input data block by selectively disabling LFSRs. In an embodiment, $t_{max}-t$ LFSRs are disabled to correct the selected maximum of t errors. In an embodiment, the method includes selectively disabling the LFSRs with an input signal.

In an embodiment, the method includes forming the $t_{max}$ polynomials as irreducible polynomials of a generator polynomial of the BCH encoder.

In an embodiment, the method further includes, in a syndrome generation state, forming the $t_{max}$ LFSRs to perform polynomial division without pre-multiplication by the factor $x^m$, and exponentiating a respective remainder polynomial of the $t_{max}$ LFSRs to produce a partial syndrome for the input data block. In an embodiment, the method further includes in the syndrome generation state exponentiating the respective LFSR state to a power related to a number of the respective LFSR to produce the partial syndrome.

Although processes for generating parity bits and decoding syndromes for BCH codes and related methods have been described for application to data storage, it should be understood that other applications of these processes such as for communication of data over a noisy channel are contemplated within the broad scope of the invention, and need not be limited to data storage applications. The error correction capability of a communication system for a noisy channel may be adapted to the actual noise level of the channel employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A Bose-Chaudhuri-Hocquenghem ("BCH") encoder, comprising:
   $t_{max}$ linear feedback shift registers ("LFSRs"), wherein
      $t_{max}$ is greater or equal to two,
      each LFSR comprises m registers,
      each LFSR implements a polynomial having a degree m,
      in a data input state, each LFSR is configured to form a remainder of a respective input stream of bits represented as an input polynomial in a variable x with a respective LFSR $m_i$ polynomial with pre-multiplication of the respective $m_i$ polynomial by a factor $x^m$, and
      in a parity generation state, each LFSR is configured to form a product of the respective input polynomial with the respective LFSR $m_i$ polynomial; and
   $t_{max}$ multiplexers, wherein
      an output of each multiplexer is coupled to a respective LFSR input,
      in the data input state, a first input of a first of the $t_{max}$ multiplexers is coupled to an input data block to the BCH encoder and a first input of each successive multiplexer is coupled to an output of a preceding LFSR,
      in the parity generation state, a second input of a last of the $t_{max}$ multiplexers is set to zero and a second input of each preceding multiplexer is coupled to an output of a succeeding LFSR.

2. The BCH encoder as claimed in claim 1, wherein the remainder represents a parity bit sequence for the input data block to the BCH encoder.

3. The BCH encoder as claimed in claim 2, wherein the parity generation state is maintained while the parity bit sequence is clocked out of the BCH encoder.

4. The BCH encoder as claimed in claim 1, wherein the data input state is maintained while the input data block is clocked into the BCH encoder.

5. The BCH encoder as claimed in claim 1, wherein the BCH encoder is configured to correct up to a selectable maximum of t errors not exceeding $t_{max}$ in the input data block.

6. The BCH encoder as claimed in claim 5, further including an excess number of LFSRs that are selectively disabled by an input signal.

7. The BCH encoder as claimed in claim 6, wherein the excess number of LFSRs comprise LFSRs beyond the number of LFSRs necessary to perform an encoding process to correct up to the selectable maximum of errors in the input data block.

8. The BCH encoder as claimed in claim 1, wherein the $m_i$ polynomials are irreducible polynomials of a generator polynomial of the BCH encoder.

9. The BCH encoder as claimed in claim 1, further including a polynomial exponentiation process coupled to an LFSR output, wherein the BCH encoder in a syndrome generation state performs polynomial division without pre-multiplication by the factor $x^m$, and wherein the exponentiation process in the syndrome generation state produces a partial syndrome from a resulting remainder polynomial of the input data block.

10. The BCH encoder as claimed in claim 9, wherein the polynomial exponentiation process raises a respective LFSR output state to a power related to a number of the respective LFSR in the syndrome generation state.

11. A method of operating a BCH encoder, the method comprising:
    forming in each of $t_{max}$ linear feedback shift registers ("LFSRs")
       a remainder polynomial of a respective input stream of bits represented as an input polynomial in a variable x with a respective one of $t_{max}$ polynomials of a degree m in the variable x with pre-multiplication of the respective $m_i$ polynomial by a factor $x^m$ when the BCH encoder is in a data input state, and
       a product of the respective remainder polynomial with the respective $m_i$ polynomial when the BCH encoder is in a parity generation state, wherein each LFSR comprises m registers, each LFSR implements a polynomial of degree m, and $t_{max}$ is greater or equal to two;
    coupling a respective output of each of $t_{max}$ multiplexers to a respective input of the $t_{max}$ LFSRs;
    coupling a first input of a first of the $t_{max}$ multiplexers to an input data block to the BCH encoder and a first input of each successive multiplexer to an output of a preceding LFSR in the data input state; and
    setting a second input of a last of the $t_{max}$ multiplexers to zero and coupling a second input of each preceding multiplexer to an output of a succeeding LFSR in the parity generation state.

12. The method as claimed in claim 11, wherein the remainder represents a parity bit sequence for the input data block to the BCH encoder.

13. The method as claimed in claim 12, further comprising maintaining the parity generation state while clocking the parity bit sequence out of the BCH encoder.

14. The method as claimed in claim 11, further comprising maintaining the data input state while clocking the input data block into the BCH encoder.

15. The method as claimed in claim 11, further comprising configuring the BCH encoder to correct up to a selectable maximum of $t_{max}$ errors in the input data block, where t is less than or equal to $t_{max}$, by selectively disabling LFSRs.

16. The method as claimed in claim 15, wherein $t_{max}$-t LFSRs are selectively disabled to correct the selectable maximum of $t_{max}$ errors.

17. The method as claimed in claim 15, further comprising selectively disabling the LFSRs with an input signal.

18. The method as claimed in claim 11, further comprising forming the $m_i$ polynomials as irreducible polynomials of a generator polynomial of the BCH encoder.

19. The method as claimed in claim 11, further comprising:
forming the $t_{max}$ LFSRs to perform polynomial division without pre-multiplication by the factor $x^m$ in a syndrome generation state; and
exponentiating a respective remainder polynomial of the $t_{max}$ LFSRs to produce a partial syndrome for the input data block in the syndrome generation state.

20. The method as claimed in claim 19, further comprising:
exponentiating the respective LFSR output state to a power related to a number of the respective LFSR to produce the partial syndrome in the syndrome generation state.

* * * * *